(12) United States Patent
Yu et al.

(10) Patent No.: US 9,157,610 B2
(45) Date of Patent: Oct. 13, 2015

(54) MANUFACTURE METHOD FOR A SURFACE MOUNTED POWER LED SUPPORT AND ITS PRODUCT

(75) Inventors: Binhai Yu, Guangdong (CN); Bairong Sun, Guangdong (CN); Weiping Li, Guangdong (CN); Xunli Xia, Guangdong (CN); Cheng Li, Guangdong (CN); Menghua Long, Guangdong (CN); Lifang Liang, Foshan (CN)

(73) Assignees: FOSHAN NATIONSTAR OPTOELECTRONICS CO., LTD., Foshan, Guangdong (CN); ZHU HAI BONTECH ELECTRONIC TECHNOLOGY CO., LTD., Jinding, Zhuhai, Guangdong (CN)

( * ) Notice: Subject to any disclaimer, the term of this patent is extended or adjusted under 35 U.S.C. 154(b) by 360 days.

(21) Appl. No.: 13/579,110

(22) PCT Filed: Aug. 25, 2010

(86) PCT No.: PCT/CN2010/076325
§ 371 (c)(1),
(2), (4) Date: Jan. 3, 2013

(87) PCT Pub. No.: WO2011/150597
PCT Pub. Date: Dec. 8, 2011

(65) Prior Publication Data
US 2013/0121007 A1    May 16, 2013

(30) Foreign Application Priority Data

Jun. 4, 2010  (CN) .......................... 2010 1 0191873
Jun. 4, 2010  (CN) ...................... 2010 2 0215719 U

(51) Int. Cl.
*F21V 19/00*   (2006.01)
*F21V 21/00*   (2006.01)
(Continued)

(52) U.S. Cl.
CPC ................. *F21V 21/00* (2013.01); *B23P 11/00* (2013.01); *H01L 33/486* (2013.01); *H05K 1/183* (2013.01);
(Continued)

(58) Field of Classification Search
CPC ..................................................... H01L 33/486
USPC ......................................................... 362/382
See application file for complete search history.

(56) References Cited

U.S. PATENT DOCUMENTS 5,656,847 A *  8/1997  Okazaki et al. ............... 257/433
8,169,129 B2    5/2012  Matsui et al.
(Continued)

FOREIGN PATENT DOCUMENTS

CN    1585143 A      2/2005
CN    101719532 A    6/2010
(Continued)

OTHER PUBLICATIONS

PCT/CN2010/076325 International Search Report dated Mar. 17, 2011 (4 p.).
(Continued)

*Primary Examiner* — Anh Mai
*Assistant Examiner* — Hana Featherly
(74) *Attorney, Agent, or Firm* — Conley Rose, P.C.

(57) ABSTRACT

A manufacture method for a surface mounted power LED support comprises providing a wiring board having both sided metal layers. In addition, the method comprises forming a hole. Further, the method comprises setting a metal layer in the surface of the hole. Still further, the method comprises thickening the metal layer of the wiring board. The method also comprises etching the metal layer of the wiring board. Moreover, the method comprises cutting the wiring board to form single support unit. A surface mounted power LED support comprises a both sided wiring board, a hole formed in the wiring board and wiring layers set on the surface of the wiring board.

21 Claims, 8 Drawing Sheets

(51) Int. Cl.
*H01L 33/48* (2010.01)
*B23P 11/00* (2006.01)
*H05K 1/18* (2006.01)
*H01L 33/62* (2010.01)

(52) U.S. Cl.
CPC ....... *H01L 33/62* (2013.01); *H01L 2224/48247* (2013.01); *H01L 2933/0033* (2013.01); *H01L 2933/0066* (2013.01); *H05K 2201/0394* (2013.01); *H05K 2201/10106* (2013.01); *Y10T 29/49996* (2015.01)

(56) References Cited

U.S. PATENT DOCUMENTS

| | | |
|---|---|---|
| 2002/0005249 A1 | 1/2002 | Kuwako et al. |
| 2002/0163006 A1 | 11/2002 | Yoganandan et al. |
| 2002/0179919 A1 | 12/2002 | Deisenhofer et al. |
| 2008/0048204 A1 | 2/2008 | Ishikura et al. |
| 2008/0315239 A1 | 12/2008 | Lin et al. |
| 2009/0014749 A1 | 1/2009 | Matsuda |
| 2009/0022198 A1 | 1/2009 | Chen et al. |
| 2009/0283781 A1 | 11/2009 | Chan et al. |
| 2010/0084167 A1 | 4/2010 | Shim et al. |

FOREIGN PATENT DOCUMENTS

| | | |
|---|---|---|
| CN | 201853743 U | 6/2011 |
| CN | 102237481 A | 11/2011 |
| EP | 1253650 A2 | 10/2002 |
| JP | 07235696 | 9/1995 |
| JP | 11284233 | 10/1999 |
| JP | 2002324917 A | 11/2002 |
| JP | 2003031850 A | 1/2003 |
| JP | 2006073842 A | 3/2006 |
| JP | 2006190814 A | 7/2006 |
| JP | 2007227422 A | 9/2007 |
| JP | 2008034622 A | 2/2008 |
| JP | 2009021426 A | 1/2009 |
| JP | 2009260394 A | 11/2009 |
| JP | 2009260395 A | 11/2009 |
| JP | 2010114427 A | 5/2010 |
| WO | 2009/069741 A1 | 6/2009 |

OTHER PUBLICATIONS

Japanese Office Action Dated Dec. 3, 2013; Japanese Application No. 2012-554194 (7 p.).

Japanese Office Action Dated Jun. 9, 2014; Japanese Application No. 2012-554194 (8 p.).

European Search Report dated Jun. 4, 2014; European Application No. 10852393.7 (9 p.).

* cited by examiner

F

G

H

MANUFACTURE METHOD FOR A SURFACE MOUNTED POWER LED SUPPORT AND ITS PRODUCT

CROSS REFERENCE TO RELATED APPLICATIONS

This application is a 35 U.S.C. §371 national stage application of PCT/CN2010/076325 filed Aug. 25, 2010, which claims the benefit of Chinese Patent Application No. 201010191873.7 filed Jun. 4, 2010 and Chinese Patent Application No. 201020215719.4 filed Jun. 4, 2010, each of which is hereby incorporated herein by reference in its entirety for all purposes.

STATEMENT REGARDING FEDERALLY SPONSORED RESEARCH OR DEVELOPMENT

Not applicable.

TECHNICAL FIELD OF THE INVENTION

The present application relates to a method for manufacturing an LED bracket applicable to an LED device and the LED bracket, in particular, to a method for manufacturing a surface mounted power LED bracket and the surface mounted power LED bracket.

BACKGROUND OF THE INVENTION

The semiconductor illumination is known as the fourth generation of illuminating source, and is gradually applied to the general illumination field. The power light emitting diode (power LED) is popular in the market because of its high brightness and high power. There are two types of conventional power LED brackets: a PLCC-type (plastic leaded chip carrier) bracket and a ceramic substrate bracket.

FIG. 1 shows a structural schematic view of a prior PLCC-type bracket. In the PLCC-type bracket, a plastic casing 01 having a reflection cavity covers a metal lead frame 02. The metal lead frame 02 includes a chip mounting portion 03 for carrying an LED chip 04, and an electrode pin 05. The chip mounting portion 03 forms an integral structure together with a positive electrode or a negative electrode. The PLCC-type bracket is particularly applicable to fields requiring a high light distribution and a high mounting density because of the reflection cavity and compact structure of the PLCC-type bracket. A high power LED may generate high heat energy in operation, thus it needs to take some technical means to help to dissipate the generated heat energy. Otherwise, the lifetime and light emitting effect of the high power LED will be affected. In a typical packaging structure of the PLCC-type bracket for the high power LED, the plastic casing having the reflection cavity not only covers the metal lead frame, but also covers a heat sink provided at the bottom of an LED chip and exposed outside the bracket. The heat sink generally employs a metal material having a good heat dissipation effect, such as copper, to facilitate the dissipation of the high heat energy generated in the operation of the LED. The PLCC-type high power LED is one of the most commonly used high power LED packaging structures because of the good heat dissipation effect thereof.

Another conventional power LED bracket is the ceramic substrate. A typical packaging structure of the ceramic substrate is shown in FIG. 2. A substrate 06 for carrying an LED chip, and a reflection cavity 07 arranged on the substrate 06 employ a ceramic material. As to a power LED device, at least one through hole 08 is provided in a chip mounting portion of the substrate 06, with a heat conductive material being filled in the through hole 08 for increasing the heat dissipation effect, to meet heat dissipation requirement of the high power LED device. Since the ceramic substrate has good insulating property and heat dissipating property, the ceramic substrate is widely applied to the high power LED field, and occupies the whole high power LED market together with the PLCC-type bracket.

However, the PLCC-type bracket and the ceramic substrate have some disadvantages. As for the PLCC-type bracket, manufacture processes thereof are complicated and require a high precision. Many relevant patent applications have been developed, however, key technologies of these patent applications are still grasped by foreign enterprises, and these technologies are relatively mature and have limited rooms for improvement. Especially for the PLCC-type bracket for a power LED, a heat sink is further needed to improve heat dissipation of the bracket. Thus, it needs to further provide a counter bore and mount the heat sink in the counter bore, which causes the structure of the PLCC-type bracket for a power LED more complicated, and thus the bracket packaging process is more complicated. At the same time, the PLCC-type high power LED has a large volume, the packaging structure thereof cannot be applied to a reflow soldering process, is not applicable to a full-automatic and batch testing and taping process and is inconvenient for a batch soldering and mounting of the down-stream products, and is particularly inconvenient for the subsequent surface mounted processes of the manufacture of the LED product. Therefore, the prior PLCC-type bracket has a complicated structure, a relatively complicated manufacture process and a relatively high production cost, which limits the subsequent manufacture processes of the product, increases the production cost of the subsequent LED products, reduces the production efficiency, and accordingly limit the application range of the PLCC-type bracket power LED.

The ceramic substrate may overcome the main disadvantages of the PLCC-type bracket, however, the ceramic substrate has some common problems, for example, manufacture processes of the ceramic substrate are difficult, cost of the ceramic substrate is high, and material of the ceramic substrate is fragile, which are key factors that restrain the ceramic substrate from fully substituting the PLCC-type bracket.

Based on the above description, there is a need to provide an LED bracket structure and a manufacture process thereof, the LED bracket structure has a simple manufacture process, a good light emitting effect, a good heat dissipation effect and a low production cost, and compared with the above PLCC-type bracket and ceramic substrate, the LED bracket structure can overcome the above technical drawbacks of the prior PLCC-type bracket and ceramic substrate. In the prior technical improvements, the person skilled in the art has already made attempts to improve the manufacture material and the manufacture process. However, these attempts can not properly solve or overcome the above technical drawbacks.

Before making the present application, applicants of the present application filed a patent application (China Patent Application No. 201010165442.3) titled "METHOD FOR MANUFACTURING A SURFACE MOUNTED POWER LED BRACKET AND THE SURFACE MOUNTED POWER LED BRACKET", which provides a method for manufacturing a surface mounted power LED bracket by employing a single-sided copper coated circuit board and a metal sheet, and the bracket product. This technical solution has such advantages as having a simple manufacture method, a low cost and a good heat dissipation effect. This technical solution can overcome drawbacks of the commonly used PLCC-type bracket and ceramic substrate for the power LED, and has a potential of occupying the power LED bracket market. However, it is discovered in the further research that, since the metal sheet is connected to the single-sided copper coated circuit board only via an adhesive film, there may be a gap between the metal sheet and the edge of the bottom of a through hole in the single-sided copper coated circuit board, which may cause the LED bracket hard to pass reliability tests such as the "red ink test", and thus affect the reliability of the power LED bracket. Further, since the bottom of the through hole and the metal sheet are not closely connected, the bottom surface of the chip mounting portion may not be continuously smooth, which may reduce the light reflection efficiency of the LED chip.

In light of the above technical drawbacks, the present application provides a new technical solution to solve the above technical drawbacks. The present application can overcome the technical prejudice, as is commonly accepted by the person skilled in the art, that an ordinary insulating board, such as a PCB board, is not applicable to be employed as a packaging material for the power LED. Meanwhile, the present application can solve the problem that there may be a gap between the metal sheet and the edge of the bottom of the through hole when using a single-sided copper coated circuit substrate as a substrate, and provides a method for manufacturing a power LED bracket and the power LED bracket with a simple process, a low cost, a high reliability, a wide application range, a high heat dissipation property and a high light reflection efficiency.

SUMMARY OF THE INVENTION

Compared with the prior ceramic substrate and PLCC-type bracket, an ordinary insulating board, such as a PCB board, has advantages such as a low cost, a relatively mature board manufacturing process, namely, the ordinary insulating board has such advantages as a low cost and easy to be manufactured. However, since the ordinary insulating board has disadvantages of poor heat dissipation effect and poor heat resisting property, on one hand, it is generally accepted, by the person skilled in the art, that the ordinary insulating board cannot meet the high heat dissipation property requirement of the power LED device, and thus can only be used for a small power LED device, thereby the ordinary insulating board has a poor universal applicability. On the other hand, problems, such as delamination and deformation of the board may occur in the packaging and die bonding process of the LED due to the poor heat resisting property of the ordinary insulating board, thus the yield rate is low, thereby it is generally accepted by the person skilled in the art that the ordinary insulating board is not applicable to be employed as a packaging material for the power LED.

The present application overcomes the above technical prejudice by employing an ordinary insulating board coated with metal layers on two sides thereof as a substrate for manufacturing a power LED bracket, and makes further technical innovations and improvements on the basis of the technical solution in which the single-sided copper coated circuit board is employed as the bracket substrate and is bonded with a the metal sheet, to overcome the existed technical drawbacks. According to the present application, an ordinary insulating board is employed as a substrate, with two sides of the insulating board being coated with metal layers to form a double-sided metal layer coated circuit board, and is used as the substrate for manufacturing the surface mounted power LED bracket. Then, by a regular manufacture process of the ordinary insulating board and an innovative and special design for the bracket structure, the present application can realize an object of providing a method for manufacturing a surface mounted power LED bracket and the surface mounted power LED bracket.

Based on the method technical solution of the present application, a method for manufacturing a surface mounted power LED bracket is provided. The method includes steps of: 1) preparing a double-sided metal layer coated circuit substrate, including; providing an ordinary insulating board as a substrate for the circuit substrate, coating an upper surface of the substrate with a first metal layer and a lower surface of the substrate with a second metal layer, thereby forming the double-sided metal layer coated circuit substrate; 2) forming a hole, including forming at least one hole in the circuit substrate by a mechanical process, a laser process or an etching process; 3) providing a hole-wall metal layer, including providing a metal layer on an inner wall of the hole by a plating process, a deposition process or a screen printing process; 4) increasing a thickness of a metal layer, including increasing a thickness of the metal layer on the lower surface of the circuit substrate by a fusion process, a deposition process or a plating process. A third metal layer is integrally formed on the second metal layer to form a thick metal layer, such that a metal layer at a bottom of the hole has a thickness that can carry an LED chip; 5) etching the metal layers, including processing the metal layers on the circuit substrate by an etching process to form a first circuit layer on the upper surface of the circuit substrate and a second circuit layer on the lower surface of the circuit substrate, wherein the first circuit layer, the second circuit layer and the hole form a power LED bracket structure; and 6) separating a power LED bracket unit from the power LED bracket structure, including separating a power LED bracket unit from the power LED bracket structure formed by the above steps by a cutting process.

It is further provided according to the present application a technical solution of a product manufactured by the above method for manufacturing the surface mounted power LED bracket. According to the technical solution of the surface mounted power LED bracket of the present application, the structure of the surface mounted power LED bracket includes a double-sided metal layer coated circuit substrate provided as a bracket substrate. The bracket substrate is provided with a hole and bracket circuit layers, thereby forming the power LED bracket. The bracket substrate comprises a first metal layer, a second metal layer and an insulating substrate provided between the first metal layer and the second metal layer. The circuit layers comprise a first circuit layer on an upper surface of the substrate and a second circuit layer on a lower surface of the substrate. The first circuit layer comprises a lead connecting portion, surrounding the hole and being used for welding a metal lead, and a first positive and negative electrode layer at two sides of the hole. The lead connecting portion is electrically connected to the first positive and negative electrode layer. The bracket substrate has a thick metal layer at a bottom thereof. The second circuit layer comprises a chip mounting portion, which is formed by the thick metal layer corresponding to a bottom of the hole, and a second positive and negative electrode layer corresponding to and electrically insulated from the chip mounting portion. The first positive and negative electrode layer and the second positive and negative electrode layer are electrically connected to form electrode of the bracket. And a metal layer is provided on an inner wall of the hole.

The present application provides a bracket structure and a method for manufacturing the bracket structure which are different from those of the prior art. The technical solutions of the present application make innovations on the manufacture process and the product structure. The present application overcomes the prior technical prejudice by employing an ordinary insulating board, with metal layers coated on both sides thereof, as a double-sided metal layer coated circuit substrate to manufacture the bracket. With the innovative design of the structure and the process of the technical solutions of the present application, and with a machining process of the ordinary insulating board and other conventional processes for manufacturing the LED bracket, the double-sided metal layer coated circuit substrate can be processed into a surface mounted power LED bracket. On one hand, the present application has simple processes, high production efficiency, good product reliability, and greatly reduces the production cost. On the other hand, with the innovative design of the bracket structure of the present application, the LED bracket made of the ordinary insulating board can meet the high heat-resistant requirement of the power LED. In the bracket structure of the present application, an LED chip directly contacts a thick metal layer which is of an integral structure, has a good heat conductivity and forms a chip mounting portion, such that heat generated by the LED chip in operation can be released to the outside directly through the thick metal layer, and thus the LED bracket has a good heat dissipation effect, a high reliability, and a good light emitting effect. It is proved through tests that, the LED bracket, made of an ordinary insulating board and with metal layers coated on both sides, has a good heat resisting property, and problems such as delamination and cracking would not occur in the die bonding process using a silver paste of the LED packaging.

Based on the above description, the method of the present application overcomes the technical prejudice generally accepted by the person skilled in the art that the ordinary insulating board cannot be employed to manufacture the power LED bracket. The ordinary insulating board is skillfully applied in the manufacture of the LED bracket, which greatly simplifies the prior manufacture process of the power LED bracket, improves the production efficiency, and reduces the production cost. The product manufactured by the method of the present application has a low cost, a high reliability, a good heat dissipation and light emitting effect, can be applied to a reflow soldering process, and is applicable to a full-automatic and batch testing and taping process, is convenient for a batch soldering and mounting of the downstream products, and is particularly convenient for the subsequent surface mounted processes of the manufacture of the LED product, and thus has a wider application range. Therefore, the present application is an invention overcoming a technical prejudice. Compared with the prior art, the method and the product of the present application achieve a notable progress and have prominent and positive advantageous technical effects.

Figure 1:
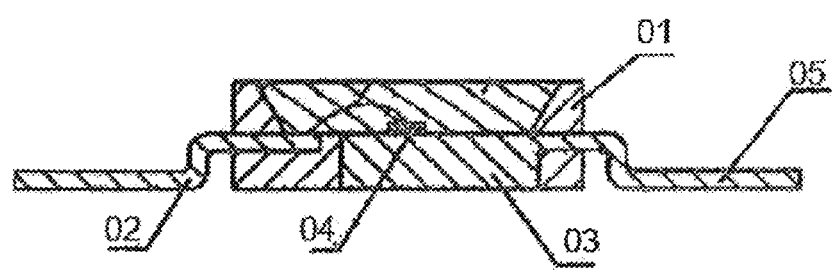
FIG. 1 is a structural schematic view of a PLCC-type bracket for a power LED in the prior art.

| Reference Numbers Utilized in the drawings: | | |
|---|---|---|
| 01. plastic casing | 02. metal lead frame | 03. chip mounting portion |
| 04. LED chip | 05. electrode pin | 06. substrate | 07. reflection cavity |
| 1. double-sided metal layer coated circuit substrate | | |
| 10. ordinary insulating substrate (for short, substrate) | | 11. first metal layer |
| 12. second metal layer | 13. blind hole | 131. metal reflection layer |
| 141. small electrode blind hole | 142. electrode conductive layer | 14. metal foil |
| 15. thick metal layer | 16. first circuit layer | 161. lead connecting portion |
| 162. first positive and negative electrode layer | | 17. second circuit layer |
| 171. chip mounting portion | 172. second positive and negative electrode layer | |
| 2. double-sided metal layer coated circuit substrate | | 20. ordinary insulating substrate |
| 21. first metal layer | 22. second metal layer | |
| 221. metal layer at an edge of a bottom of a through hole | | |
| 222. metal layer at an edge of a bottom of a small electrode through hole | | |
| 23. through hole | 231. metal reflection layer | 24. metal foil | 25. adhesive film |
| 26. first circuit layer | 261. lead connecting portion | |
| 262. first positive and negative electrode layer | | 27. second circuit layer |
| 271. chip mounting portion | 272. second positive and negative electrode layer | |
| 281. small electrode through hole | 282. electrode conductive layer | |
| 3. bracket substrate | 31. through hole | 311. hole-wall metal layer |
| 32. positive and negative electrode | 321. small electrode through hole | |
| 322. electrode conductive layer | 33. first metal layer | 34. second metal layer |
| 341. metal layer at a bottom of the through hole | | |
| 342. metal layer at a bottom of a small electrode through hole | | 35. metal foil |
| 351. chip mounting portion | 352. second positive and negative electrode layer | |
| 36. adhesive film | 37. cup-shaped covering board | 371. cup hole |
| 4. bracket substrate | 41. blind hole | 411. hole-wall metal layer |
| 42. positive and negative electrode | 421. small electrode blind hole | |

-continued

Reference Numbers Utilized in the drawings:

43. first metal layer　　　　　　431. lead connecting portion
432. first positive and negative electrode layer　　　　44. second metal layer
441. chip mounting portion　　442. second positive and negative electrode layer
422. electrode conductive layer　　45. cup-shaped covering board
451. cup hole　　46. adhesive film

DETAILED DESCRIPTION OF THE INVENTION

Figure 2:
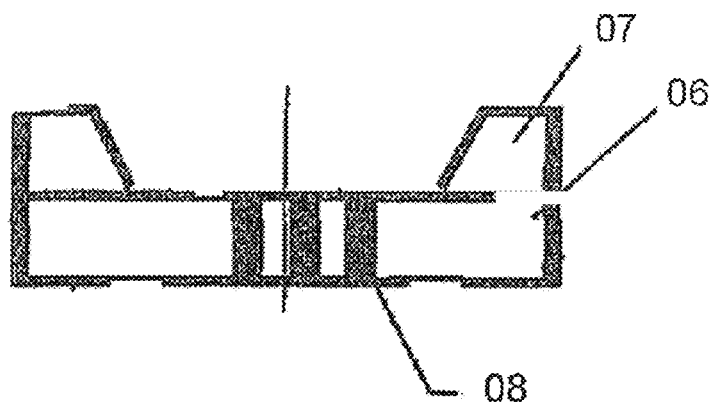
FIG. 2 is a structural schematic view of a ceramic substrate bracket for a power LED in the prior art.

A PLCC-type bracket in the prior art is shown in FIG. 1. A plastic casing 01 having a reflection cavity covers a metal lead frame 02, and a chip mounting portion 03 for carrying an LED chip 04 and an electrode pin 05 are provided on the metal lead frame 02. A ceramic substrate in the prior art is shown in FIG. 2. A substrate 06 for carrying an LED chip and a reflection cavity 07 provided on the substrate 06 employ a ceramic material.

Figure 3:
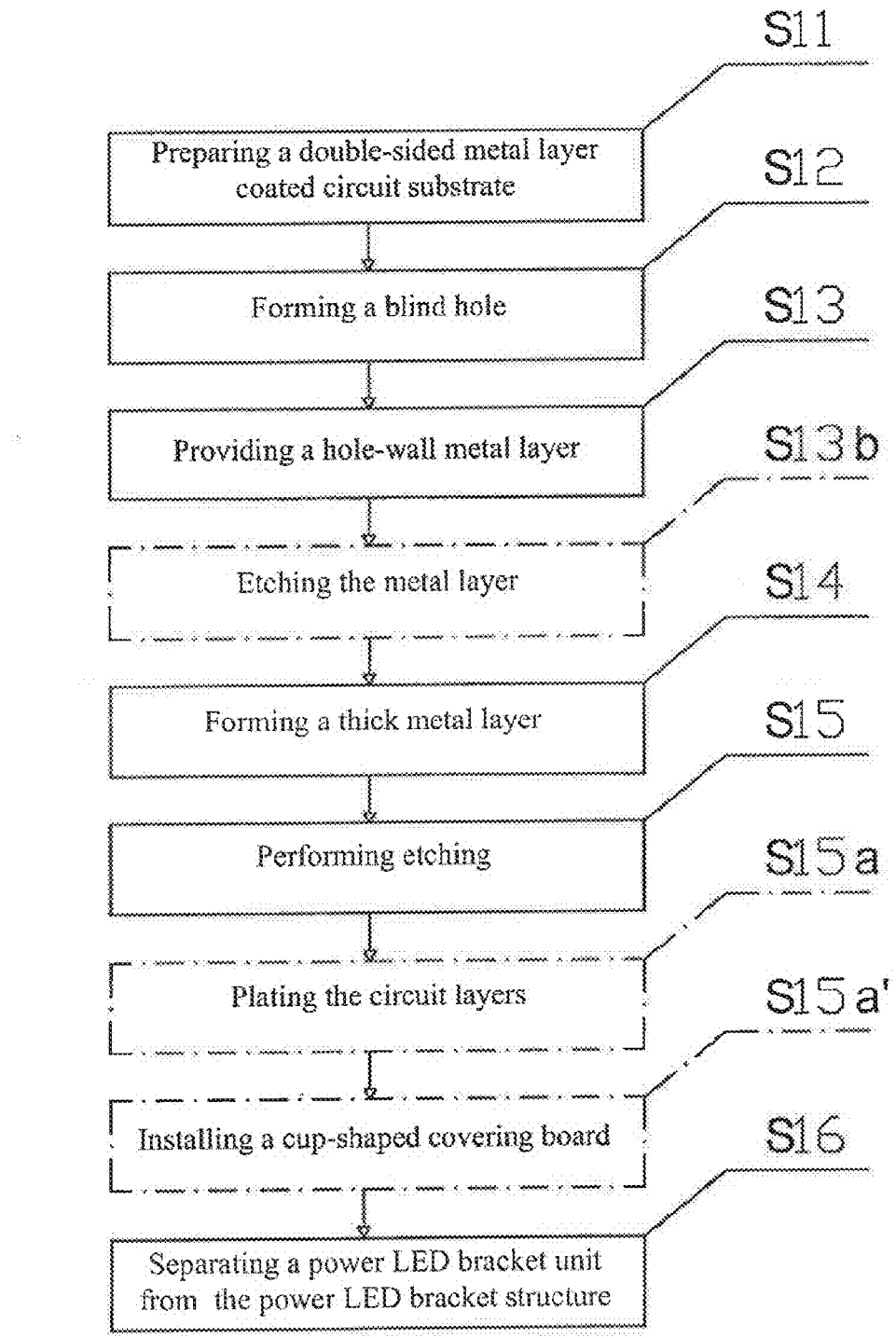
FIG. 3 is a process flow chart of a method according to a first embodiment of the present application.
Figure 4:
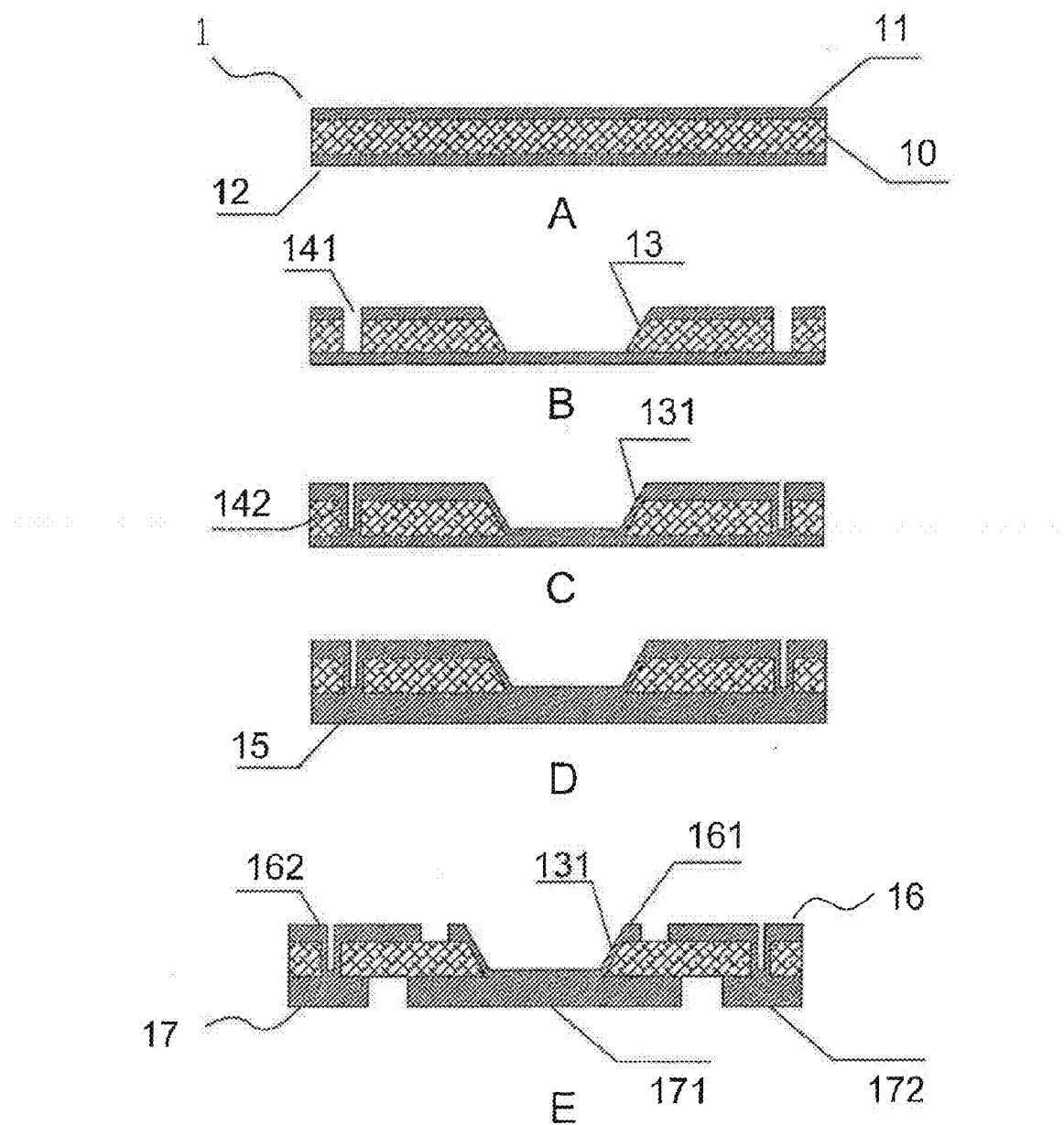
FIG. 4 is a schematic view of process steps of the method according to the first embodiment of the present application.

A method for manufacturing a power LED bracket according to a first embodiment of the present application is shown in FIGS. 3 and 4. Manufacture steps of the embodiment are described in detail in conjunction with the process flow chart of the embodiment shown in FIG. 3 and the schematic view of the process steps shown in FIG. 4.

Step S11), preparing a double-sided metal layer coated circuit substrate: A double-sided metal layer coated circuit substrate 1 is prepared in advance. As shown in FIG. 4A, the circuit substrate 1 includes an ordinary insulating substrate 10, a first metal layer 11 coated on the upper surface of the substrate and a second metal layer 12 coated on the lower surface of the substrate 10. There is no special requirement on the material of the substrate 10. The substrate may be an ordinary insulating board such as a PCB board. Preferably, the substrate may be cheap materials, such as a fiber-glass cloth substrate, a CEM-3 (Composite Epoxy Material Grade-3) substrate, or a CEM-1 (Composite Epoxy Material Grade-1) substrate. It is also preferable to employ a bismaleimide-triazine resin (BT) substrate and similar base materials. Preferably, the metal layers employ copper layers.

Step S12), forming a blind hole: At least one blind hole 13 is formed on the double-sided metal layer coated circuit substrate by a mechanical process, a laser process or an etching process, with the bottom of the blind hole 13 being formed by the second metal layer. In other words, the second metal layer is remained (as shown in FIG. 4B). Preferably, the blind hole may be formed as a blind hole array of M rows×N columns to form a bracket substrate structure having the blind hole 13 array of M rows×N columns (not shown in FIG. 2). In another preferable solution, at least one small electrode blind hole 141 may be formed at each side of two sides of the blind hole in the step, to form a part of an electrode (as shown in FIG. 4).

Step S13), providing a hole-wall metal layer: A metal reflection layer 131 is provided on an inner wall of the blind hole 13 by a plating process, a deposition process or a screen printing process. Preferably, the metal reflection layer may be a copper layer or a silver layer to increase light emitting effect of an LED device. In the preferable solution with the small electrode blind holes 141, an electrode conductive layer 142 is provided on the inner wall of each small electrode blind hole 141 (as shown in FIG. 4C) in the step S13), to form a part of a positive electrode or a part of a negative electrode. Preferably, the electrode conductive layer may be a cooper layer or a silver layer so as to improve conductive property of the electrode.

Step S14), forming a thick metal layer: A third metal layer is integrally formed on the second metal layer 12 of the double-sided metal layer coated circuit substrate 1 by a hot melt process, a plating process or a deposition process, to further increase a thickness of the metal layer, thereby forming a thick metal layer 15 (as shown in FIG. 4D). Preferably, the third metal layer may be a copper layer. In one preferable solution, a third metal layer is formed on the second metal layer 12 by a plating process or a deposition process, such that the third metal layer and the second metal layer 12 form the thick metal layer 15 having a thickness that can carry an LED chip. In another preferable solution, firstly, a metal foil 14 is laminated and bonded, at the lower surface of the double-sided metal layer coated circuit substrate 1 to the double-sided metal layer coated circuit substrate 1, such that the metal foil 14 is physically connected to the second metal layer 12 at the bottom of the circuit substrate (not shown in FIG. 4); then, the metal foil 14 and the metal layer 12 at the bottom of the circuit substrate are closely connected into an integral structure by a hot melt process, a plating process or a deposition process, to form the thick metal layer 15. In this solution, it is preferable to provide an adhesive film between the metal foil 14 and the bottom of the circuit substrate; then the adhesive film is melted, when being heated at a high temperature, into a state having a bonding property; and then the metal foil 14 is laminated such that the metal foil 14 is physically bonded to the bottom of the circuit substrate, to form a fake connection as shown in FIGS. 4E and 4F; lastly, the metal foil 14 and the metal layer 12 at the bottom of the circuit substrate are closely connected into an integral structure by the hot melt process, the plating process or the deposition process, thereby forming the thick metal layer 15.

Step S15), Performing etching: A first circuit layer 16 is formed by the first metal layer and a second circuit layer 17 is formed by the thick metal layer 15, by an etching process. The first circuit layer 16 includes a lead connecting portion 161 and a first positive and negative electrode layer 162 electrically connected to the lead connecting portion 161. The second circuit layer 17 includes a chip mounting portion 171 and a second positive and negative electrode layer 172 electrically insulated from the chip mounting portion 171. The bottom of the blind hole 13 acts as the chip mounting portion 171 for carrying the LED chip. In the preferable solution with the small electrode blind holes 141, a conductive metal layer 142 is provided on the inner wall of each small electrode blind hole 141, and the conductive metal layer 142 is electrically connected to the first positive and negative electrode layer 162 and the second positive and negative electrode layer 172, to form a positive electrode and a negative electrode (as shown in FIG. 4E). The first circuit layer, the second circuit layer and the blind hole form a power LED bracket structure.

Step S16), separating a power LED bracket unit from the power LED bracket structure: The power LED bracket structure formed by the above steps is processed by a cutting process to obtain a separate power LED bracket unit.

Some non-essential and optional steps may be further included in the above steps, for example: An etching step S13b) may be performed before the step S14). Most of the second metal layer on the lower surface of the circuit substrate is removed by an etching process, to remain at least the metal layer surrounding the bottom of the blind hole as a basis of the second circuit layer in the subsequent processes. Step S13b) is non-essential and may be omitted.

A step of plating the circuit layers S15a) may be performed after the step 15). A metal layer is further provided on the first circuit layer 16, the second circuit layer 17, the upper surface of the metal foil at the bottom of the blind hole 13 and the metal layer on the inner wall of the blind hole by a plating process, so as to increase luminance brightness and solderability of the bracket. The metal layer further provided may be a silver layer, a gold layer, a tin layer or other similar metal layers. Step Si 5a) is non-essential and may be omitted.

A step of installing a cup-shaped covering board S15a') may be performed after the step S15). Step S15a') is a non-essential and optional step, and comprises the following sub-steps: sub-step 1), preparing a substrate. There is no special requirement on the material of the substrate. The substrate may be an ordinary insulating board such as a PCB board. Preferably, the substrate may be cheap materials such as a fiber-glass cloth substrate, a CEM-3 (Composite Epoxy Material Grade-3) substrate, a CEM-1. (Composite Epoxy Material Grade-1) substrate, a FR-1 (Flame Resistant Laminates Grade-1) and a FR-2 (Flame Resistant Laminates Grade-2). It is also preferable to employ a bismaleimide-triazine resin substrate and similar base materials. Sub-step 2), forming a cup hole, the position and the number of which is corresponding to the position and the number of the blind hole formed in the step S12), on the substrate by a mechanical process, a laser process or an etching process, to form a cup-shaped covering board. Preferably, the cup hole is of a reflection cup shape or a cylindrical shape. Sub-step 3), coating a black material on the upper surface of the cup-shaped covering board to increase contrast ratio of a device. Sub-step 4), bonding the cup-shaped covering board to the upper surface of the circuit substrate formed by the step S15) or the step S15a). The cup hole has a diameter larger than a diameter of the blind hole, such that the cup-shaped covering board covers the other portions of the first circuit layer except for the lead connecting portion. Among the above sub-steps, sub-step 3) is optional, and thus may be omitted. A preferable embodiment of sub-step 4) is as follows: A) providing an adhesive film between the cup-shaped covering board and the upper surface of the circuit substrate; B) heating the adhesive film at a high temperature till the adhesive film is melted into a state having an adhesive property, thereby bonding the cup-shaped covering board to the upper surface of the circuit substrate.

Steps S15a) and S15a') are non-essential, thus one of the two steps or both of them may be omitted in other embodiments.

An ordinary insulating board is processed in the above processes which are easy to perform and can achieve a high yield rate. Compared with the prior art, the above processes can greatly improve the production efficiency and reduce the production cost.

The power LED bracket unit formed by the above steps is of a surface mounted bracket, and can substitute the prior PLCC-type bracket and ceramic substrate bracket for a high power LED. The power LED bracket unit formed by steps including step S15a') can substitute the prior conventional top light-illuminating LED bracket, and is particularly applicable to a top light-illuminating LED device for a display screen.

The present embodiment employs some simple processes, in which a metal conductive layer 131 of the blind hole is formed on the double-sided metal layer coated circuit substrate 1, and an integral thick metal layer is formed by directly forming a third metal layer on the second metal layer of the circuit substrate or bonding a metal foil on the second metal layer to form a close connection. The processes can solve problems, for example, there may be a gap between an edge of the bottom of the hole and the metal sheet, and it is difficult to pass reliability tests such as the "red ink test" due to the gap, which improves the reliability of the power LED bracket. At the same time, in the processes of the embodiment, an integral thick metal layer is formed at the bottom of the blind hole such that a smooth connection is formed at the bottom of the blind hole, thereby the light emitting rate of the LED product can be increased.

Figure 5:
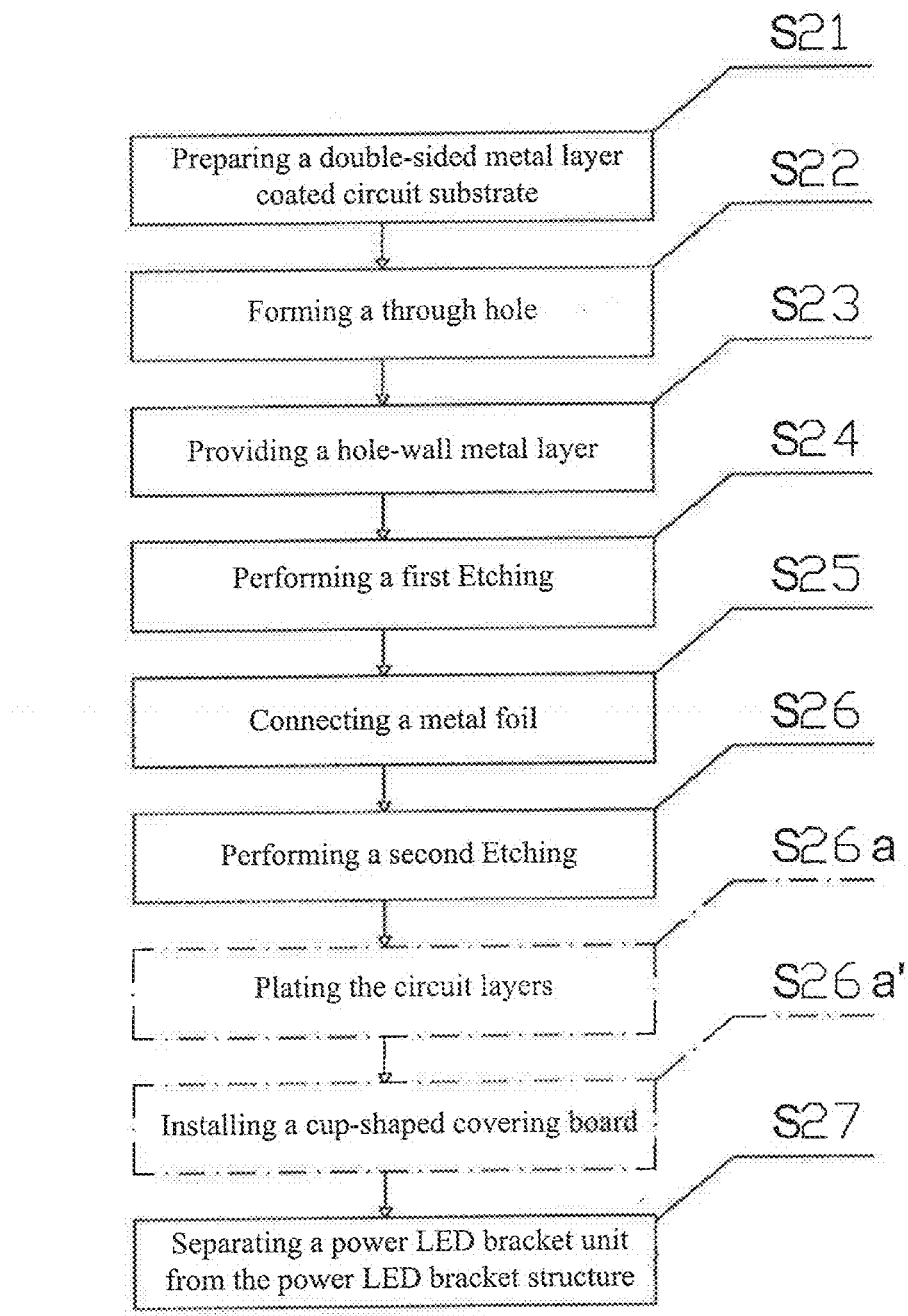
FIG. 5 is a process flow chart of a method according to a second embodiment of the present application.
Figure 6:
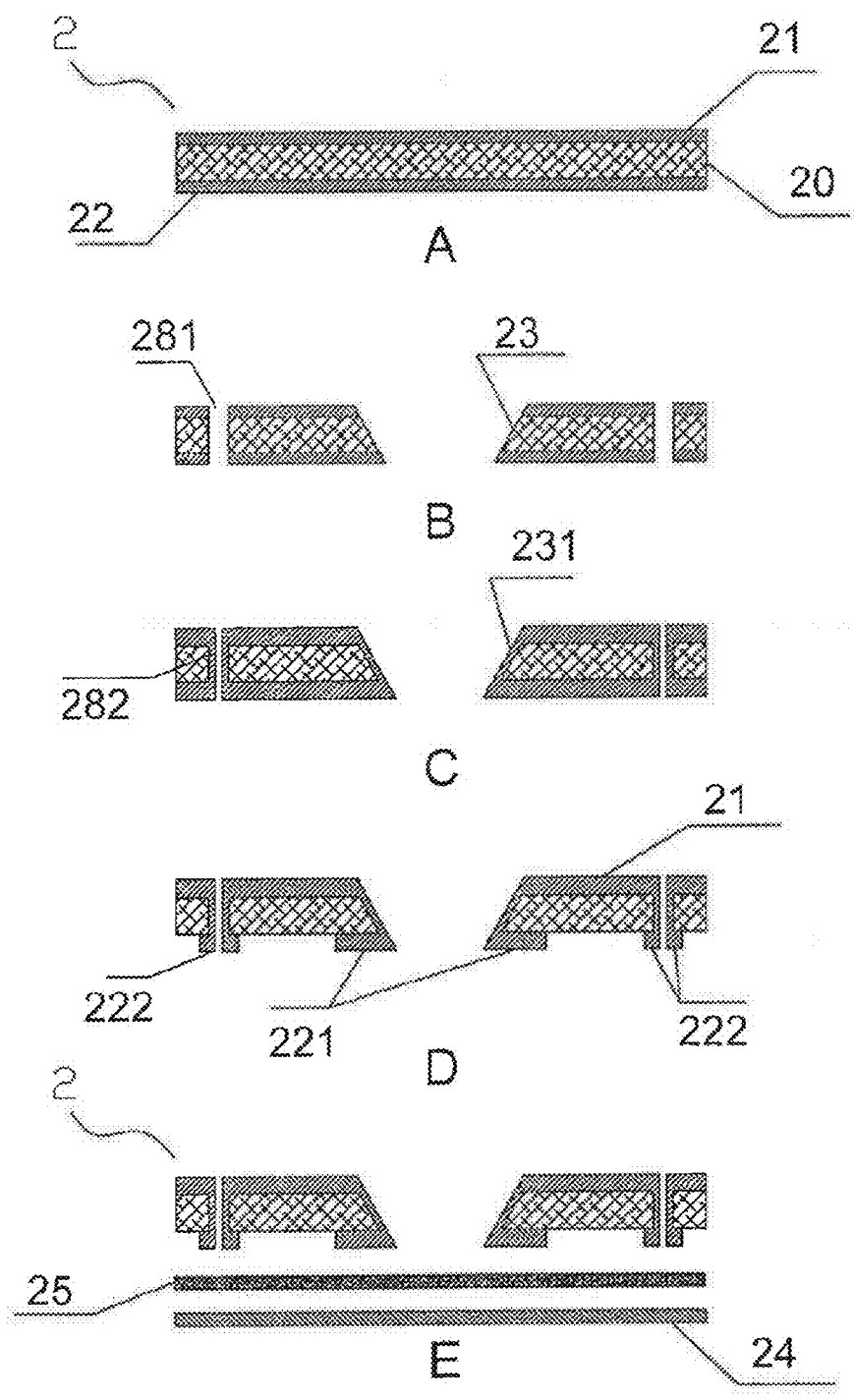
FIG. 6 is a schematic view of process steps of the method according to the second embodiment of the present application.
Figure 6:
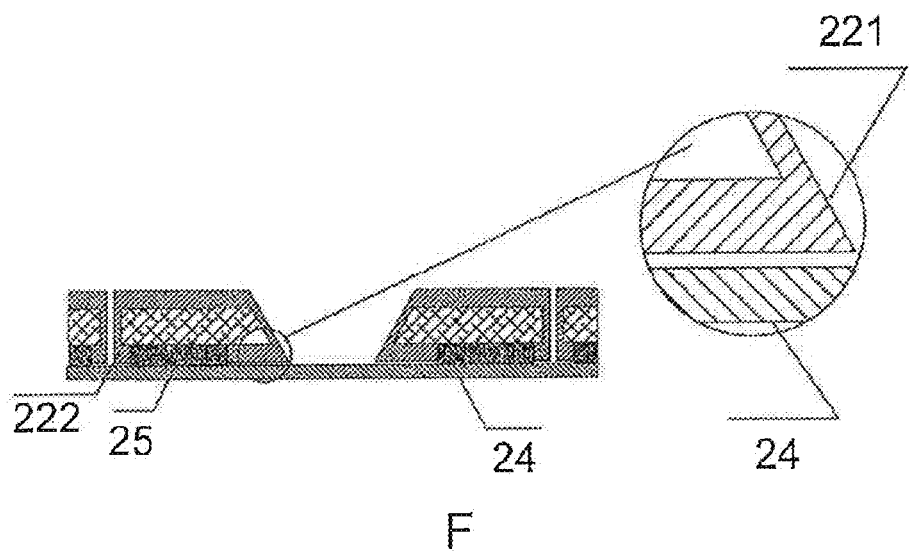
Figure 6:
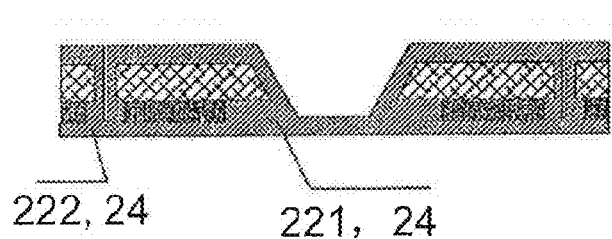
Figure 6:
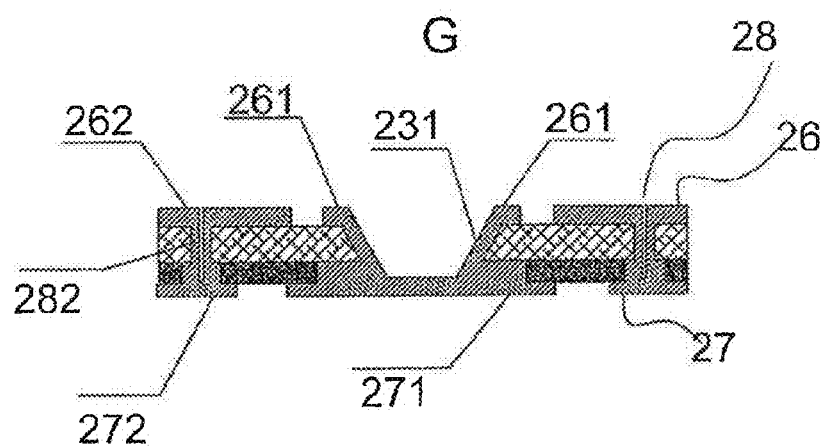

A method for manufacturing a power LED bracket according to a second embodiment of the present application is shown in FIGS. 5 and 6. Manufacture steps of the embodiment are described in detail in conjunction with the process flow chart of the embodiment shown in FIG. 5 and the schematic view of process steps shown in FIG. 6.

Step S21), preparing a double-sided metal layer coated circuit substrate: A double-sided metal layer coated circuit substrate 2 is prepared in advance. The circuit substrate 2 includes an ordinary insulating substrate 20, a first metal layer 21 coated on the upper surface of the substrate and a second metal layer 22 coated on the lower surface of the substrate. There is no special requirement on the material of the substrate 20. The substrate may be an ordinary insulating board such as a PCB board. Preferably, the substrate may be cheap materials such as a fiber-glass cloth substrate (FR-4), a CEM-3 (Composite Epoxy Material Grade-3) substrate, or a CEM-1 (Composite Epoxy Material Grade-1) substrate. It is also preferable to employ a bismaleimide-triazine resin (BT) substrate and similar base materials. Preferably, the metal layers are copper layers.

Step S22), forming a through hole: At least one through hole 23 is formed on the double-sided metal layer coated circuit substrate 2 by a mechanical process, a laser process or an etching process (as shown in FIG. 6B). In one preferable solution, the through hole may be formed as a through hole array of M rows×N columns to form a bracket substrate having the through hole 23 array of M rows×N columns (not shown in FIG. 6). In another preferable solution, at least one small electrode through hole 281 is formed at each side of two sides of the through hole in the step, to form a part of an electrode.

Step S23), providing a hole-wall metal layer: A metal layer 231 having a reflective property is provided on the inner wall of the through hole 23 by a plating process, a deposition process or a screen printing process. In the preferable solution with the small electrode through holes 281, a metal layer is provided on the inner wall of each small electrode through hole to form an electrode conductive layer 282 (as shown in FIG. 6C), so as to form a part of a positive electrode or a part of a negative electrode.

Step S24), Performing a first etching: The first metal layer 21 on the upper surface of the metal layer coated circuit substrate is remained. Most of the second metal layer 22 on the lower surface of the metal layer coated circuit substrate is removed by an etching process to remain a metal layer 221 surrounding the edge of the bottom of the through hole 23 as a basis of a chip mounting portion to be formed in the subsequent processes. In the preferable solution with the small electrode through holes, a metal layer 222, in the second metal layer 22, surrounding the edge of the bottom of each small electrode through hole 281 is remained as a basis of a second positive and negative electrode layer to be formed in the subsequent processes, so as to form a part of the positive and negative electrode layers of the bracket (as shown in FIG. 6D).

Step S25), increasing a thickness of a metal layer: A thickness of the metal layer on the lower surface of the circuit substrate is increased by a hot melt process, a deposition process or a plating process. A third metal layer is integrally formed on the second metal layer to form a thick metal layer, such that the metal layer at the bottom of the hole has a thickness that can carry an LED chip.

One preferable solution for realizing the step is to provide a metal foil to increase the thickness of the metal layer. That is, a metal foil 24 is laminated, at a lower surface of the double-sided metal layer coated circuit substrate 2, on the double-sided metal layer coated circuit substrate 2 to form a thick metal layer. Two sub-steps are included: 1) laminating the metal foil, comprising laminating and bonding the metal foil 24 to the bottom of the circuit substrate by a bonding process, to form a fake connection as Shown in FIG. 6F; 2) integrally connecting the metal foil with the metal layer at the bottom of the circuit substrate, comprising closely connecting the metal foil and the metal layer at the bottom of the circuit substrate into an integral structure by a hot melt process, a plating process or a deposition process, to form the thick metal layer.

In the above preferable solution, the sub step of laminating the metal foil may be realized by bonding the metal foil 24 to the bottom of the double-sided metal layer coated circuit substrate 2 via an adhesive film 25. The following sub-steps are included: A) providing the adhesive film 25 between the metal foil 24 and the bottom of the double-sided metal layer coated circuit substrate 2; B) heating the adhesive film 25 at a high temperature till the adhesive film 25 is melted into a state having an adhesive property, then laminating and bonding the metal foil 24 to the bottom of the double-sided metal layer coated circuit substrate 2, such that the metal foil 24 and the double-sided metal layer coated circuit substrate 2 are physically connected together to form the fake connection shown in FIG. 6F. In the preferable solution with the small electrode through holes, a fake connection as shown in FIG. 6F is further formed between the metal foil 24 and the metal layer 222 at the bottom of each small electrode through hole 281 of the circuit substrate. The step of integrally connecting the metal foil with the double-sided metal layer coated circuit substrate may be realized by a hot melt process, a plating process or a deposition process, such that the metal foil 24 and the metal layer 221 around the through hole of the double-sided metal layer coated circuit substrate 2 are closely connected into an integral structure, so as to realize the integration of the metal foil and the double-sided metal layer coated circuit substrate. Preferably, in the solution with the small electrode through holes, it further includes a sub-step of closely connecting the metal foil 24 and the metal layer 222 at the bottom of each small electrode through hole 281 of the circuit substrate to form an integral thick metal layer (as shown in FIGS. 6E, 6F, and 6G).

In the present step, though the metal foil 24 is physically connected to the double-sided metal layer coated circuit substrate 2 after the sub step of laminating the metal foil, the metal foil 24 and the metal layer 221 at the bottom of the through hole 23 do not form an integral structure, which may cause the LED bracket fail to pass the reliability tests such as the "red ink test" and may affect the reliability and stability of the LED bracket. The metal foil 24 is closely connected with the bottom of the double-sided metal layer coated circuit substrate 2 by the step of integrally connecting the metal foil with the double-sided metal layer coated circuit substrate, which can achieve the integration of the metal foil and the double-sided metal layer coated circuit substrate, overcome the problem of failing to pass the reliability tests, and increase the reliability of the power LED bracket. Further, the bottom of the through hole can be smoothened by the step, which increases light reflection rate of the through hole.

Step S26), Performing a second etching: A first circuit layer 26 is formed by the first metal layer 21 and a second circuit layer 27 is formed by the thick metal layer, by an etching process. The first circuit layer 26 includes a lead connecting portion 261 and a first positive and negative electrode layer 262 electrically connected to the lead connecting portion 261. The second circuit layer 27 includes a chip mounting portion 271 and a second positive and negative electrode layer 272 electrically insulated from the chip mounting portion 271. A portion of the metal foil 24 locating at the bottom of the through hole 23 and sealing the bottom of the through hole 23 acts as the chip mounting portion 271 for carrying the LED chip. In the preferable solution with a positive small electrode through hole and a negative small electrode through hole (as shown in FIG. 6H), the second positive and negative electrode layer 272 formed in the etching process is a metal layer locating at the bottom of the small electrode through hole 281 and sealing the bottom of the small electrode through hole 281. The metal layer 282 on the inner wall of each small electrode through hole 281 is electrically connected to the first positive and negative electrode layer 262, and the second positive and negative electrode layer 272, respectively, to form a positive electrode or a negative electrode 28 of the power LED bracket (as shown in FIG. 6H).

Similar to the first embodiment, an optional step of plating the circuit layer S26a) may be performed after the step of etching the metal layer, comprising: forming a metal plating layer on the first circuit layer 26, the second circuit layer 27, the upper surface of the metal foil 24 at the bottom of the through hole 23 and the metal layer 231 on the inner wall of the through hole 23 by a plating process, to increase luminance brightness and solderability of the bracket. The metal plating layer may be a silver layer, a gold layer, a tin layer or other similar metal layers. Similar to the first embodiment, an optional step of installing a cup-shaped covering board S26a') may be performed after the step of etching the metal layer. Detailed sub-steps of step S26a") are similar to relevant contents described in the first embodiment, and will not be described herein. The above two optional steps are non-essential, thus one of the two steps or both of them may be omitted in other embodiments.

Step S27), separating a power LED bracket unit from the power LED bracket structure, comprising processing the power LED bracket structure formed by the above steps by a cutting process to obtain a separate power LED bracket unit. An ordinary insulating board is processed in the above processes which are easy to perform and can achieve a high yield rate. Compared with the prior art, the above processes can greatly improve the production efficiency and reduce the production cost.

The present embodiment employs some simple processes, in which a metal conductive layer 231 of the through hole is formed on the double-sided metal layer coated circuit substrate 2, and an integral thick metal layer is formed after bonding the metal foil to the second metal layer and forming a close connection. These processes can solve problems, for example, there may be a gap between the edge of the bottom of the hole and the metal layer, and it is difficult to pass reliability tests such as the "red ink test" due to the gap, which improves the reliability of the power LED bracket. At the same time, in the processes of the embodiment, the metal layer provided on the inner wall of the through hole form an integral structure with the thick metal layer at the bottom of the through hole such that a smooth connection is formed at the bottom of the hole, thereby the light emitting rate of the LED product can be increased.

Figure 7:
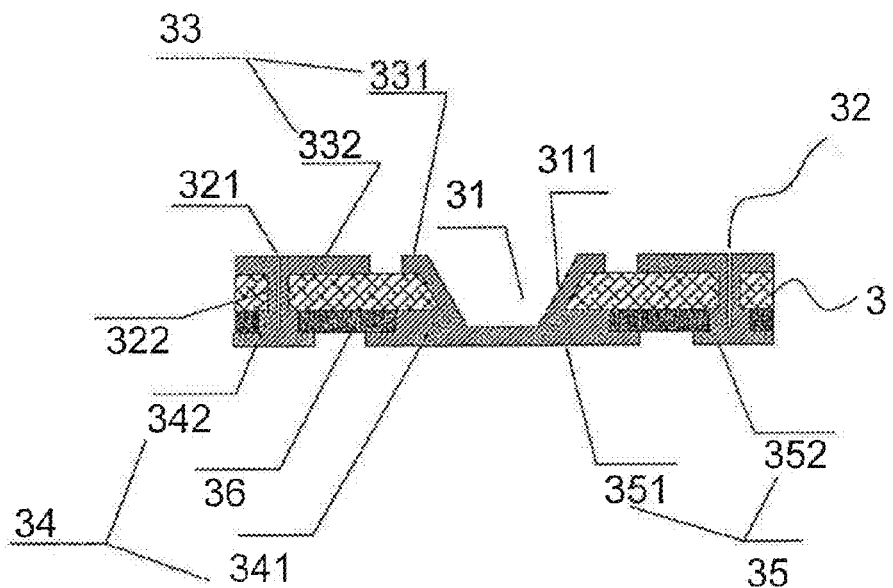
FIG. 7 is a structural schematic view of a power LED bracket according to a first embodiment of the present application.

A power LED bracket according to the present application is shown in FIG. 7. The power LED bracket includes: a bracket substrate 3 employing a double-sided metal layer coated circuit substrate; at least one through hole 31 provided in the bracket substrate 3; positive and negative electrode 32 at two sides of the through hole 31; and a chip mounting portion 351 at the bottom of the through hole 31. The bracket substrate 3 includes a first metal layer 33, a second metal layer 34 and an insulating substrate provided between the first metal layer and the second metal layer. Preferably, each of the positive and negative electrode 32 includes at least one small electrode through hole 321 penetrating the bracket substrate 3. An inner wall of each small electrode through hole 321 is provided with a conductive layer 322 or is filled with a conductive material (not shown). The first metal layer 33 is formed as a first circuit layer, and the first circuit layer includes: a lead connecting portion 331 around the through hole 31, for soldering a metal lead; and a first positive and negative electrode layer 332 located at two sides of the through hole and electrically connected to the lead connecting portion 331. The second metal layer 34 is formed as a second circuit layer, and the second circuit layer includes a metal layer 341 surrounding the bottom of the through hole 31 and a metal layer 342 surrounding the bottom of each small electrode through hole 321. A metal layer 311 having a reflective property is provided on the inner wall of the through hole 31. A metal foil 35 is further provided at the bottom of the bracket substrate 3, with a portion of the metal foil 35 sealing the bottom of the through hole 31 acting as a chip mounting portion 351. The metal foil 35 is bonded to the bottom of the bracket substrate 3 via an adhesive film 36 and forms an integral structure with the metal layer 341 at the bottom of the through hole 31. The metal foil 35 further includes a second positive and negative electrode layer 352 electrically insulated from the chip mounting portion 351. The electrode conductive layers 322 or the conductive materials (not shown) are electrically connected to the first positive and negative electrode layer 332 and the second positive and negative electrode layer 352.

Figure 8:
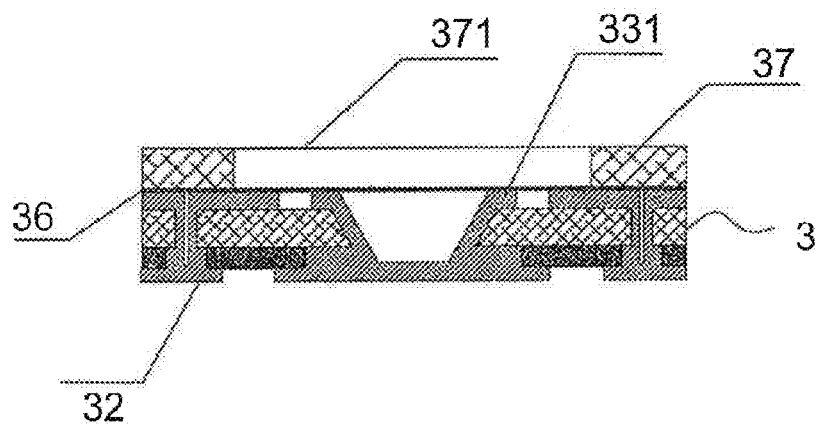
FIG. 8 is a structural schematic view of a power LED bracket according to a second embodiment of the present application.

A power LED bracket according to another embodiment of the present application is shown in FIG. 8. The power LED bracket of the present embodiment differs from the power LED bracket according to the first embodiment by further including a cup-shaped covering board 37 provided on the upper surface of the bracket substrate 3. The cup-shaped covering board 37 is connected to the upper surface of the bracket substrate 3 via an adhesive film 36, and further includes a cup hole 371 corresponding to the position of the through hole 31. A diameter of the cup hole 371 is larger than a diameter of the through hole 31, with the lead connecting portion 331 being exposed in the cup hole 371 and the positive and negative electrode 32 being covered by the cup-shaped covering board 37. Preferably, the cup hole 371 of the cup-shaped covering board 37 may be of a reflection cup shape or a cylindrical shape, and is not limited to the present embodiment. Preferably, the upper surface of the cup-shaped covering board 37 may be coated with a black material to increase the contrast ratio. Thus this kind of power LED bracket is particularly applicable to an indoor or outdoor LED display screen.

Figure 9:
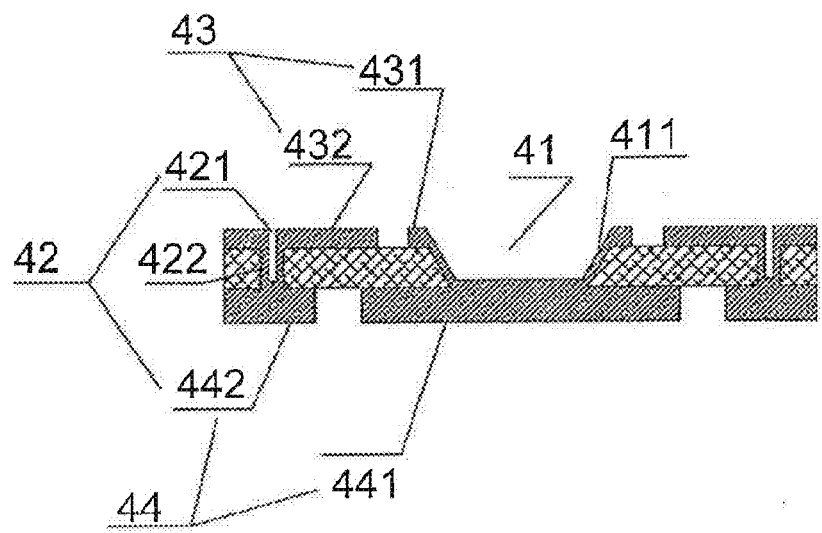
FIG. 9 is a structural schematic view of a power LED bracket according to a third embodiment of the present application.

A power LED bracket according to another embodiment of the present application is shown in FIG. 9. The power LED bracket includes: a bracket substrate 4 employing a double-sided metal layer coated circuit substrate; at least one blind hole 41 provided in the bracket substrate 4; and positive and negative electrode 42 located at two sides of the blind hole 41. The bracket substrate 4 includes a first metal layer 43, a second metal layer 44 and an insulating substrate provided between the first metal layer and the second metal layer. The first metal layer 43 is formed as a first circuit layer, and the first circuit layer includes: a lead connecting portion 431 around the blind hole 41, for soldering a metal lead; and a first positive and negative electrode layer 432 located at two sides of the blind hole and electrically connected to the lead connecting portion 431. The second metal layer 44 is formed as a second circuit layer, and the second circuit layer includes a metal layer (referred to as a chip mounting portion 441) acting as the bottom of the blind, hole 41 and a second positive and negative electrode layer 442. A metal layer 411 having a reflective property is provided on the inner wall of the blind hole 41. The chip mounting portion 441 is electrically insulated from the second positive and negative electrode layer 442. Preferably, each of the positive and negative electrode 42 includes at least one small electrode blind hole 421 penetrating the first metal layer 43 and the substrate 4 of the bracket. An inner wall of each small electrode blind hole 421 is provided with an electrode conductive layer 422 or is filled with a conductive material (not shown), and the electrode conductive layer 422 or the conductive material is electrically connected to the first positive and negative electrode layer 432 and the second positive and negative electrode layer 442.

Figure 10:
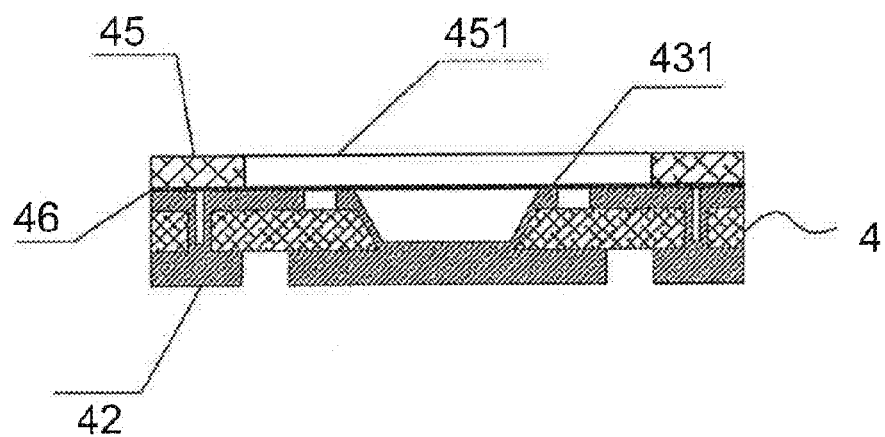
FIG. 10 is a structural schematic view of a power LED bracket according to a fourth embodiment of the present application.

A power LED bracket according to another of the present application is shown in FIG. 10. The power LED bracket of the present embodiment differs from the power LED bracket according to the third embodiment by further including a cup-shaped covering board 45 provided on the upper surface of the bracket substrate 4. The cup-shaped covering board 45 is connected to the upper surface of the bracket substrate 4 via an adhesive film 46, and further includes a cup hole 451 corresponding to the position of the blind hole 41. A diameter of the cup hole 451 is larger than a diameter of the blind hole 41, with the lead connecting portion 431 being exposed in the cup hole 451 and the positive and negative electrode 42 being covered by the cup-shaped covering board 45. The cup-shaped covering board 45 may be of a reflection cup shape or a cylindrical shape, and is not limited to the present embodiment. In other embodiments, the upper surface of the cup-shaped covering board 45 may be coated with a black material to increase the contrast ratio. Thus this kind of power LED bracket is particularly applicable to an indoor or outdoor LED display screen.

To sum up, the present application overcomes the technical prejudice in the prior art by employing an ordinary insulating board as a substrate for manufacturing a power LED bracket. The present application employs a simple processing method and can achieve a high yield rate. The product manufactured according to the present application has a unique structural design, a low production cost, a high universal applicability, a good heat dissipation effect, can be widely applied, and is applicable to an industrial batch production. In a word, the present application achieves prominent advantageous effects.

What is claimed is:

1. A method for manufacturing a surface mounted power LED bracket, comprising steps of:
   1) preparing a double-sided metal layer coated circuit substrate comprising: providing an ordinary insulating board as a substrate for the circuit substrate, coating an upper surface of the substrate with a first metal layer and a lower surface of the substrate with a second metal layer, thereby forming the double-sided metal layer coated circuit substrate;

2) forming a hole, comprising: forming at least one hole in the circuit substrate by a mechanical process, a laser process or an etching process;

3) providing a hole-wall metal layer, comprising: providing a metal layer on an inner wall of the hole by a plating process, a deposition process or a screen printing process;

4) increasing a thickness of a metal layer, comprising: increasing a thickness of the metal layer on the lower surface of the circuit substrate, by forming a third metal layer integrated with the second metal layer by a hot melt process, to form a thick metal layer, such that a metal layer at a bottom of the hole has a thickness that can carry an LED chip;

wherein the third metal layer comprises a metal foil, and wherein forming the thick metal layer includes:
laminating and bonding the metal foil to the second metal layer; and
integrally connecting the metal foil with the second metal layer by the hot melt process to form the thick metal layer;

5) etching the metal layers, comprising: processing the metal layers on the circuit substrate by an etching process, to form a first circuit layer on the upper surface of the circuit substrate and a second circuit layer on the lower surface of the circuit substrate, wherein the first circuit layer, the second circuit layer and the hole form a power LED bracket structure; and 6) separating a power LED bracket unit from the power LED bracket structure, comprising:
separating, by a cutting process, a power LED bracket unit from the power LED bracket structure formed by the above steps.

2. The method according to claim 1, wherein before the step 4), the method further comprises:
an etching step, comprising: removing most of the second metal layer on the lower surface of the circuit substrate by the etching process, to remain at least the second metal layer surrounding the bottom of the hole as a basis of the second circuit layer.

3. The method according to claim 1, wherein,
in the step 2), at least one small electrode hole is formed at each side of two sides of the hole, to form a part of an electrode;
in the step 3), a hole-wall metal conductive layer is provided on an inner wall of each small electrode hole, to form a part of the electrode;
before the step 4), the method further comprises an etching step, comprising: removing most of the second metal layer on the lower surface of the circuit substrate by the etching process, to remain at least the second metal layer surrounding the bottom of the hole and a bottom of each small electrode hole; and
in the step 5), the formed first circuit layer comprises: a lead connecting portion surrounding the hole, and a first positive and negative electrode layer electrically connected to the lead connecting portion; the formed second circuit layer comprises: a chip mounting portion at the bottom of the hole, and a second positive and negative electrode layer electrically insulated from the chip mounting portion, wherein the chip mounting portion is configured carry the LED chip, and the first positive and negative electrode layer is electrically connected to the second positive and negative electrode layer; the formed first positive and negative electrode layer and the formed second positive and negative electrode layer correspond to the small electrode holes and are electrically connected to the hole-wall metal conductive layer on the inner wall of each small electrode hole, wherein the first positive and negative electrode layer, the second positive and negative electrode layer and the hole-wall metal conductive layers of the small electrode holes form a positive electrode and a negative electrode of the bracket.

4. The method according to claim 3, wherein,
in the step 1), the insulating board is a fiber-glass cloth substrate, a CEM-3 substrate, a CEM-1 substrate or a bismaleimide-triazine resin (BT) substrate, and the metal layers coated on the insulating board are copper layers;
in the step 2), the formed hole is a hole array of M rows×N columns;
in the step 3), the hole-wall metal layer is a copper layer or a silver layer; and
in the step 4), the third metal layer is a copper layer.

5. The method according to claim 1, wherein before the step 6), the method further comprises a step of: installing a cup-shaped covering board, comprising:
sub-step 1), preparing an insulating substrate;
sub-step 2), forming a cup-shaped body, which is corresponded to the hole formed in the step 2), on the substrate by a mechanical process, a laser process or an etching process, a diameter of an opening of the cup-shaped body being larger than a diameter of the hole, thereby forming the cup-shaped covering board; and
sub-step 3), installing and bonding the cup-shaped covering board on the upper surface of the circuit substrate, with the hole being exposed and the other portions of the first circuit layer except for the lead connecting portion being covered.

6. The method according to claim 5, wherein,
in the sub-step 2), the insulating substrate is a fiber-glass cloth substrate, a CEM-3 substrate, a CEM-1 substrate, a FR-1 substrate, a FR-2 substrate or a bismaleimide-triazine resin (BT) substrate, and the formed cup hole is of a reflection cup shape or a cylindrical shape;
after the sub-step 2), the method further comprises a sub-step of coating a black material on an upper surface of the cup-shaped covering board to increase a contrast ratio of a device; and
in the sub-step 3), the cup-shaped covering board is bonded to the upper surface of the circuit substrate via an adhesive film.

7. The method according to claim 1, wherein,
in the step 2), the formed hole is a blind hole, and a bottom of the blind hole is formed by the second metal layer;
in the step 4), the thickness of the metal layer on the lower surface of the circuit substrate is increased by the hot melt process, the second metal layer is provided thereon with the third metal layer by the hot melt process, to form the integral thick metal layer, such that the metal layer at the bottom of the blind hole has a thickness that can carry the LED chip; and
in the step 5), the first circuit layer formed by the etching process comprises a lead connecting portion surrounding the blind hole and a first positive and negative electrode layer electrically connected to the lead connecting portion, the second circuit layer formed by the etching process comprises a chip mounting portion at the bottom of the blind hole and a second positive and negative electrode layer electrically insulated from the chip mounting portion, wherein the etched chip mounting portion is formed by the thick metal layer at the bottom of the blind hole and is configured to carry the LED chip, and the first positive and negative electrode layer is electrically connected to the second positive and negative electrode layer, to form a positive electrode and a negative electrode of the bracket.

8. The method according to claim 7, wherein,
before the step 4), the method further comprises: an etching step, comprising removing most of the second metal layer on the lower surface of the circuit substrate by the etching process, to remain at least the second metal layer surrounding the bottom of the blind hole as a basis of the second circuit layer.

9. The method according to claim 7, wherein,
the step 2) further comprises, forming at least one small electrode blind hole at each side of two sides of the blind hole, a bottom of each small electrode blind hole being formed by the second metal layer, to form a part of an electrode;
the step 3) further comprises, providing a conductive metal layer on an inner wall of each small electrode blind hole by a plating process, a deposition process or a screen printing process; and
in the step 5), the first positive and negative electrode layer formed by the etching process comprises the first metal layer remained around each small electrode blind hole, the second positive and negative electrode layer formed by the etching process comprises the thick metal layer remained at the bottom of each small electrode blind hole, wherein the first positive and negative electrode layer and the second positive and negative electrode layer formed by the etching process, and the metal layer on the inner wall of each small electrode blind hole are electrically connected to form a positive electrode and a negative electrode of the bracket.

10. The method according to claim 1, wherein,
in the step 2), the formed hole is a through hole; and
in the step 5), the first circuit layer is formed by etching the first metal layer, and the first circuit layer comprises a lead connecting portion surrounding the through hole and a first positive and negative electrode layer electrically connected to the lead connecting portion; the second circuit layer is formed by etching the thick metal layer, and the second circuit layer comprises a chip mounting portion at a bottom of the through hole and a second positive and negative electrode layer electrically insulated from the chip mounting portion, wherein the chip mounting portion is formed by the thick metal layer at the bottom of the through hole and is configured to carry the LED Chip, and the first positive and negative electrode layer and the second positive and negative electrode layer form a positive electrode and a negative electrode of the bracket.

11. The method according to claim 10, wherein,
before the step 4), the method further comprises: an etching step, comprising: removing most of the second metal layer on a lower surface of the circuit substrate by the etching process, to remain at least the second metal layer surrounding the bottom of the through hole as a basis of the second circuit layer; and
in the step 4), the laminating and bonding of the metal foil in the sub-step of laminating the metal foil comprises: providing an adhesive film between the metal foil and the lower surface of the circuit substrate; heating the adhesive film at a high temperature until the adhesive film is melted into a state having an adhesive property; and then laminating the metal foil, such that the metal foil is physically bonded to the bottom of the circuit substrate, to form the fake connection.

12. The method according to claim 11, wherein,
the step 2) further comprises, forming at least one small electrode through hole at each side of two sides of the through hole, to form a part of an electrode;
the step 3) further comprises, providing a metal conductive layer on an inner wail of each small electrode through hole by a plating process, a deposition process or a screen printing process;
in the etching step before the step 4), the metal layer surrounding a bottom of each small electrode through hole is remained as a basis of the second electrode layer;
in the step 4), the sub-step of laminating the metal foil comprises: laminating and bonding the metal foil to the lower surface of the circuit substrate to form a fake connection with the metal layer on the lower surface of the circuit substrate; and
in the step 5), the first positive and negative electrode layer formed by the etching process is electrically connected to the metal conductive layer on the inner wall of each small electrode through hole, the second positive and negative electrode layer formed by the etching process is a portion of the thick metal layer at the bottom of each small electrode through hole and is electrically connected to the metal conductive layer on the inner wall of each small electrode through hole, wherein the first positive and negative electrode layer, the second positive and negative electrode layer and the small electrode through holes form the positive electrode and the negative electrode of the bracket.

13. A surface mounted power LED bracket structure manufactured by the method according to claim 1, comprising:
a double-sided metal layer coated circuit substrate provided as a circuit substrate for the bracket, the circuit substrate comprising an ordinary insulating substrate which is employed as a substrate, a first metal layer coated on an upper surface of the substrate and a second metal layer coated on a lower surface of the substrate; at least one hole provided in the circuit substrate, a metal layer is provided on an inner wall of the hole, and a third metal layer is integrally formed on the second metal layer to form a thick metal layer, such that a metal layer at a bottom of the hole has a thickness that can carry an LED chip; a first circuit layer provided on an upper surface of the circuit substrate and a second circuit layer provided on a lower surface of the circuit substrate, wherein the first circuit layer, the second circuit layer and the hole form the power LED bracket structure, from which a separate power LED bracket unit can be separated by cutting the power LED bracket structure.

14. The bracket structure according to claim 13, wherein,
the circuit substrate employs a PCB board as an insulating board, and is formed with a hole array of M rows×N columns; most of the second metal layer on the lower surface of the circuit substrate is removed, to remain at least the second metal layer surrounding the bottoms of the holes as a basis of the second circuit layer; and the second circuit layer comprises the second metal layer remained on the lower surface of the circuit substrate and an etched third metal layer;
the first circuit layer comprises a lead connecting portion surrounding the holes and a first positive and negative electrode layer electrically connected to the lead connecting portion, the second circuit layer comprises a chip mounting portion at the bottoms of the holes and a second positive and negative electrode layer electrically insulated from the chip mounting portion, wherein the chip mounting portion is configured to carry the LED chip, and the first positive and negative electrode layer and the second positive and negative electrode layer are electrically connected; and at least one small electrode hole is formed at each side of two sides of the hole, to form a part of an electrode, an hole-wall metal conductive layer is provided on an inner wall of each small electrode hole or a conductive material is filled in each small electrode hole, to form a part of the electrode; most of the second metal layer on the lower surface of the circuit substrate is removed, to remain at least the second metal layer surrounding the bottoms of the holes and the bottoms of the small electrode holes; positions of the first positive and negative electrode layer and the second positive and negative electrode layer correspond to the small electrode holes and are electrically connected to the metal conductive layers on the inner walls of the small electrode holes or the conductive material in the small electrode holes, respectively, wherein the first positive and negative electrode layer, the second positive and negative electrode layer and the metal conductive layers of the small electrode holes form the positive electrode and the negative electrode of the bracket.

15. The bracket structure according to claim 13, wherein, the hole is a blind hole, with a bottom of the blind hole being formed by the second metal layer; the second metal layer is formed thereon with the third metal layer by a hot melt process, to form an integral thick metal layer, such that the metal layer at the bottom of the blind hole has the thickness that can carry the LED chip; the first circuit layer comprises a lead connecting portion surrounding the blind hole and a first positive and negative electrode layer electrically connected to the lead connecting portion; the second circuit layer comprises a chip mounting portion at the bottom of the blind hole and a second positive and negative electrode layer electrically insulated from the chip mounting portion, wherein the chip mounting portion is formed by the thick metal layer at the bottom of the blind hole and is configured to carry the LED chip, and the first positive and negative electrode layer and the second positive and negative electrode layer are electrically connected to form a positive electrode and a negative electrode of the bracket.

16. The bracket structure according to claim 15, wherein, at least one small electrode blind hole is formed at each side of two sides of the blind hole, with a bottom of each small electrode blind hole being formed by the second metal layer to form a part of an electrode; a metal conductive layer is provided on an inner wall of each small electrode blind hole; the first positive and negative electrode layer comprises the first metal layer remained around each small electrode blind holes; the second positive and negative electrode layer comprises the thick metal layer remained at the bottom of each small electrode blind hole; and the first positive and negative electrode layer and the second positive and negative electrode layer formed by an etching process, and the metal layer on the inner wall of each small electrode blind hole are electrically connected to form the positive electrode and the negative electrode of the bracket.

17. The bracket structure according to claim 15, wherein, the bracket structure further comprises a cup-shaped covering board provided on the upper surface of the bracket substrate, the cup-shaped covering board being bonded to the upper surface of the bracket substrate; the cup-shaped covering board comprises a cup hole corresponding to a position of the hole; a diameter of the cup hole is larger than that of the hole, such that the lead connecting portion is exposed in the cup hole and the first positive and negative electrode layer is covered by the cup-shaped covering board.

18. The bracket structure according to claim 13, wherein, the hole is a through hole;
the first circuit layer comprises a lead connecting portion surrounding the through hole and a first positive and negative electrode layer electrically connected to the lead connecting portion; and
the second circuit layer comprises a chip mounting portion at a bottom of the through hole and a second positive and negative electrode layer electrically insulated from the chip mounting portion,
wherein the chip mounting portion is formed by the thick metal layer at the bottom of the through hole and is configured to carry the LED chip, and the first positive and negative electrode layer and the second positive and negative electrode layer are electrically connected to form a positive electrode and a negative electrode of the bracket.

19. The bracket structure according to claim 18, wherein, at least the second circuit layer surrounds a bottom of the through hole.

20. The bracket structure according to claim 19, wherein, at least one small electrode through hole is provided at each side of two sides of the through hole, and a conductive layer is provided on an inner wall of each small electrode through hole;
the second electrode layer surrounds a bottom of the at least one small electrode through hole;
the first positive and negative electrode layer is electrically connected to the metal conductive layer on the inner wall of each small electrode through hole, the second positive and negative electrode layer is formed by the thick metal layer at the bottom of each small electrode through hole and is electrically connected to the metal conductive layer on the inner wall of each small electrode through hole; and
the first positive and negative electrode layer, the second positive and negative electrode layer and the small electrode through holes form the positive electrode and the negative electrode of the bracket.

21. The bracket structure according to claim 18, wherein, the bracket structure further comprises a cup-shaped covering board provided on the upper surface of the bracket substrate, the cup-shaped covering board being bonded to the upper surface of the bracket substrate; the cup-shaped covering board comprises a cup hole corresponding to a position of the hole; a diameter of the cup hole is larger than that of the hole, such that the lead connecting portion is exposed in the cup hole and the first positive and negative electrode layer is covered by the cup-shaped covering board.

* * * * *